United States Patent [19]

Lyu

[11] Patent Number: 5,751,020

[45] Date of Patent: May 12, 1998

[54] STRUCTURE OF A LIQUID CRYSTAL DISPLAY UNIT HAVING EXPOSED CHANNEL REGION

[75] Inventor: Ki Hyun Lyu, Kyungki-do, Rep. of Korea

[73] Assignee: LG Electronics Inc., Seoul, Rep. of Korea

[21] Appl. No.: 760,143

[22] Filed: Dec. 3, 1996

[30] Foreign Application Priority Data

Mar. 26, 1996 [KR] Rep. of Korea ............... 1996/8389

[51] Int. Cl.$^6$ .................... H01C 29/04; H01C 31/036
[52] U.S. Cl. ........................... 257/72; 257/59
[58] Field of Search ........................... 257/52, 72

*Primary Examiner*—Tom Thomas
*Assistant Examiner*—Fetsum Abraham
*Attorney, Agent, or Firm*—Morgan, Lewis & Bockius LLP

[57] ABSTRACT

A liquid crystal display unit includes a substrate; a gate electrode formed on the substrate; a gate insulating layer formed on the exposed surface of the substrate including the gate electrode; an intrinsic semiconductor layer and an impurity layer formed on the gate insulating layer; source and drain electrodes separately formed on the impurity semiconductor layer; an insulating layer formed on the source and drain electrodes, the insulating layer having a contact hole for exposing a channel region; and a pixel electrode formed on the insulating layer and connected to the drain electrode.

8 Claims, 6 Drawing Sheets

1

STRUCTURE OF A LIQUID CRYSTAL DISPLAY UNIT HAVING EXPOSED CHANNEL REGION

BACKGROUND OF THE INVENTION

1. Field of the Invention

The present invention relates to a liquid crystal display unit, and more particularly to a structure of a liquid crystal display unit and fabricating method thereof which can raise the fabrication yield by reducing the number of mask processes.

2. Discussion of the Related Art

If there are large number of mask processes in the fabrication of a liquid crystal display unit, the fabrication yield is reduced and the fabrication cost is high since the mask process time is lengthy. Recently, techniques for reducing the number of mask processes in fabricating the liquid crystal display unit have been proposed.

FIG. 1 illustrates a structure of a conventional liquid crystal display unit. The conventional liquid crystal display unit includes a substrate 1, a gate electrode 2 formed on the substrate 1, a gate insulating layer 3 formed on the exposed surface of the substrate 1 including the gate electrode 2, an intrinsic semiconductor layer 4 and an impurity semiconductor layer 5 formed on the gate insulating layer 3, source and drain electrodes 6 and 7 formed on the impurity semiconductor layer 5 and separated by the channel length, a passivation layer 8 formed on the source and drain electrodes 6 and 7 and the exposed surface of the gate insulating layer 3, and a pixel electrode 10 formed on the passivation layer 8 and connected to the drain electrode 7.

FIGS. 2a to 2e illustrate layout views and fabricating processes of the conventional liquid crystal display unit of FIG. 1.

Referring to FIG. 2a, a metal material is deposited on the glass substrate 1 and selectively removed by a photolithographic process and an etching process to form the gate electrode 2 for driving an active layer. Although not shown in the drawing, a storage capacitor electrode, a source pad and a gate pad are simultaneously formed when forming the gate electrode 2.

Next, as shown in FIG. 2b, an oxide layer or a nitride layer is deposited on the entire surface of the substrate 1 including the gate electrode 2 to form the gate insulating layer 3. The amorphous silicon layer 4 for forming the active layer is formed on the gate insulating layer 3. The n+ amorphous silicon layer 5 is formed on the amorphous silicon layer 4 in consideration of a contact resistance between the active layer and the source and drain electrodes formed in a subsequent process. The n+ amorphous silicon layer 5 and the amorphous silicon layer 4 are selectively removed by exposure and development using an active region pattern mask.

Referring to FIG. 2C, a metal material is deposited on the entire surface of the substrate 1 and selectively removed by the photolithographic process to form the source and drain electrodes 6 and 7. The n+ amorphous silicon layer 5 on the channel region is selectively removed by the exposure and development using the source and drain electrodes 6 and 7 as a mask.

Referring to FIG. 2d, the passivation layer 8 is deposited on the entire surface of the substrate 1 including the source and drain electrodes 6 and 7 and selectively removed until a portion of the drain electrode 7 is exposed to form a contact hole 9.

Referring to FIG. 2e, an ITO (indium/tin/oxide) layer is deposited on the entire surface of the substrate 1 electrically connected to the drain electrode 7 through the contact hole 9. The ITO layer is then selectively removed to form the pixel electrode 10.

Thus, the fabrication of a transistor in the liquid crystal display unit is completed through five mask processes. Meanwhile, although not shown in the drawings, an additional mask process is required to expose the source pad and the gate pad, as well as five mask processes for the gate electrode, semiconductor layer, source and drain electrodes, contact hole and pixel electrode.

As previously noted, since five or more mask processes are needed to fabricate the liquid crystal display unit, the fabrication process is complicated and the fabrication time is increased. Hence, the fabrication yield is reduced and the fabrication cost is increased.

SUMMARY OF THE INVENTION

Accordingly, the present invention is directed to a structure of a liquid crystal display unit and fabricating method thereof that substantially obviates one or more of the problems due to limitations and disadvantages of the related art.

It is an object of the invention to provide a structure of liquid crystal display unit and fabricating method therefor which can simplify the fabrication process and improve the fabrication yield by reducing the number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the structure of a liquid crystal display unit includes a substrate; a gate electrode formed on the substrate; a gate insulating layer formed on the exposed surface of the substrate including the gate electrode; an intrinsic semiconductor layer and an impurity layer formed on the gate insulating layer; source and drain electrodes separately formed on the impurity semiconductor layer; an insulating layer formed on the source and drain electrodes, the insulating layer having a contact hole for exposing a channel region; and a pixel electrode formed on the insulating layer and connected to the drain electrode.

In another aspect, the method for fabricating a liquid crystal display unit on a substrate includes the steps of: forming a gate electrode on the substrate, and depositing a gate insulating layer on the entire surface of the substrate; sequentially depositing an intrinsic semiconductor layer, an impurity semiconductor layer and a conductive layer on the gate insulating layer, and patterning the intrinsic semiconductor layer, the impurity semiconductor layer and the conductive layer so as to remain on an active region; forming an insulating layer on the exposed surface of the gate insulating layer including the conductive layer, the impurity semiconductor layer and the intrinsic semiconductor layer; simultaneously forming first and second contact holes by selectively removing the insulating layer so as to expose a top portion of a channel region of the intrinsic semiconductor layer and the conductive layer of a pixel electrode contact region, respectively; forming a pixel electrode on a pixel region so as to be connected to the conductive layer through the second contact hole; and forming source and drain electrodes by selectively removing the conductive layer and the impurity semiconductor layer of the channel region using the pixel electrode and the insulating layer as a mask.

In another aspect, the liquid crystal display unit includes a substrate; a gate electrode formed on the substrate; a gate insulating layer formed on the substrate and the gate electrode; an intrinsic semiconductor layer formed on the gate insulating layer, the intrinsic semiconductor layer having a channel region; an impurity layer formed on the intrinsic semiconductor layer; a source electrode formed on the impurity semiconductor layer; a drain electrode formed on the impurity semiconductor layer, the source and drain electrodes being separated; an insulating layer formed on the source and drain electrodes, the insulating layer having a contact hole exposing the channel region; and a pixel electrode formed on the insulating layer, the pixel electrode being connected to the drain electrode.

In another aspect, the method for fabricating a liquid crystal display unit on a substrate includes the steps of: forming a gate electrode on the substrate; depositing a gate insulating layer on the substrate and the gate electrode; sequentially depositing an intrinsic semiconductor layer, an impurity semiconductor layer, and a conductive layer on the gate insulating layer; patterning the intrinsic semiconductor layer, the impurity semiconductor layer, and the conductive layer, wherein the intrinsic semiconductor layer, the impurity semiconductor layer, and the conductive layer remain on an active region, and wherein a portion of the gate insulating layer is exposed; forming an insulating layer on the gate insulating layer, the conductive layer, the impurity semiconductor layer and the intrinsic semiconductor layer; simultaneously forming first and second contact holes by selectively removing the insulating layer, the first contact hole over a channel region and the second contact hole over a pixel electrode contact region; forming a pixel electrode on the pixel electrode contact region so as to be connected to the conductive layer through the second contact hole; and forming source and drain electrodes by selectively removing portions of the conductive layer and the impurity semiconductor layer over the channel region using the pixel electrode and the insulating layer as a mask.

In accordance with one aspect of the invention, a structure of a liquid crystal display unit includes: a substrate; a gate electrode formed on the substrate; a gate insulating layer formed on the exposed surface of the substrate including the gate electrode; an intrinsic semiconductor layer and an impurity layer formed on the gate insulating layer; source and drain electrodes separately formed on the impurity semiconductor layer; an insulating layer having a contact hole for exposing a channel region, formed on the source and drain electrodes; and a pixel electrode formed on the insulating layer and connected to the drain electrode.

In accordance with another aspect of the invention, a method for fabricating a liquid crystal display unit includes the steps of: preparing a substrate; forming a gate electrode on the substrate, and depositing a gate insulating layer on the entire surface of the substrate; sequentially depositing an intrinsic semiconductor layer, an impurity semiconductor layer and a conductive layer on the gate insulating layer, and patterning the intrinsic semiconductor layer, the impurity semiconductor layer and the conductive layer so as to remain on an active region; forming an insulating layer on the exposed surface of the gate insulating layer including the conductive layer, the impurity semiconductor layer and the intrinsic semiconductor layer; simultaneously forming first and second contact holes by selectively removing the insulating layer so as to expose a top portion of a channel region of the intrinsic semiconductor layer and the conductive layer of a pixel electrode contact region, respectively; forming a pixel electrode on a pixel region so as to be connected to the conductive layer through the second contact hole; and forming source and drain electrodes by selectively removing the conductive layer and the impurity semiconductor layer of the channel region using the pixel electrode and the insulating layer as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
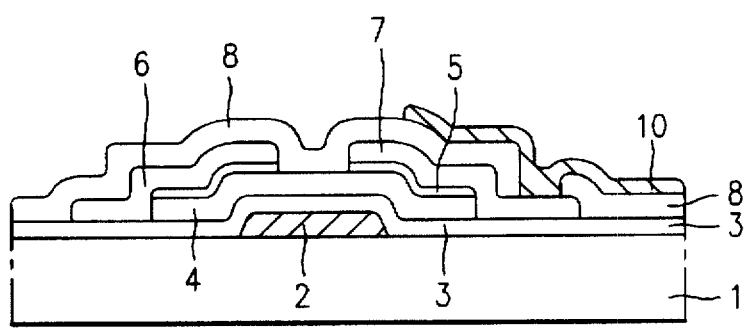
FIG. 1 is a sectional view showing a structure of a conventional liquid crystal display unit.
Figure 2A:
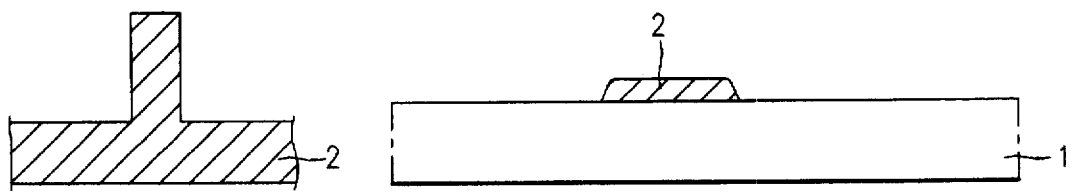
FIGS. 2a to 2e are layout views and sectional views of a fabrication process of the conventional liquid crystal display unit of FIG. 1.
Figure 2B:
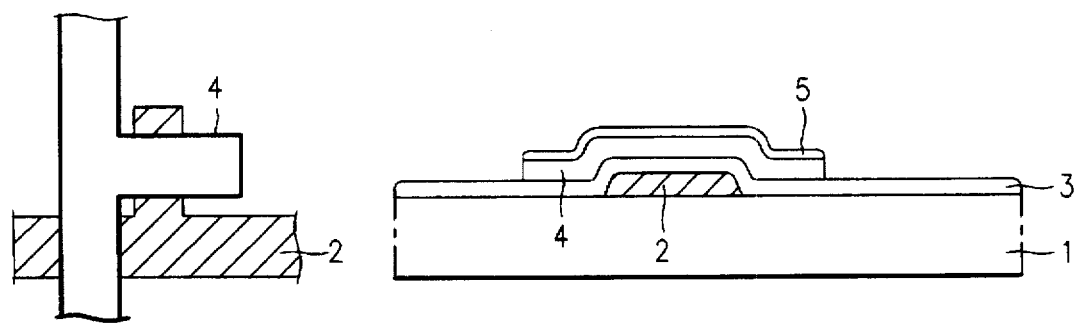
Figure 2C:
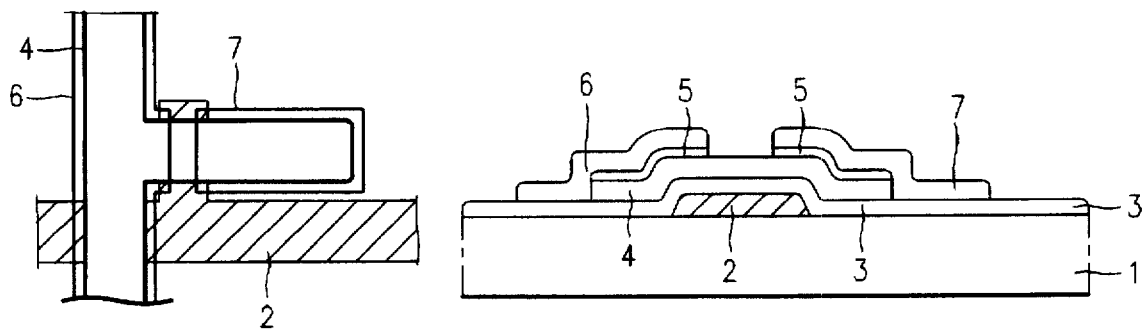
Figure 2D:
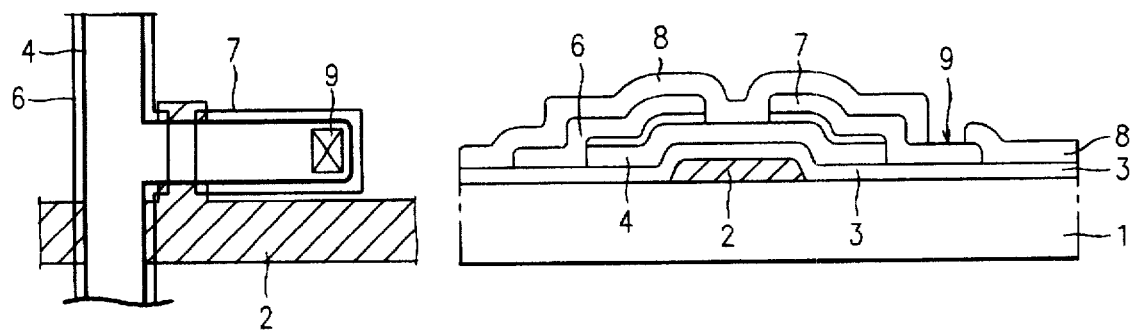
Figure 2E:
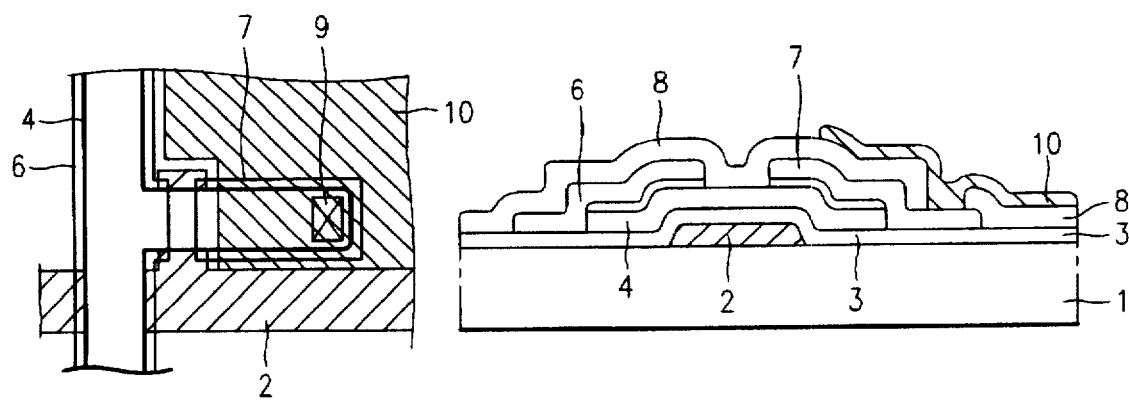
Figure 3:
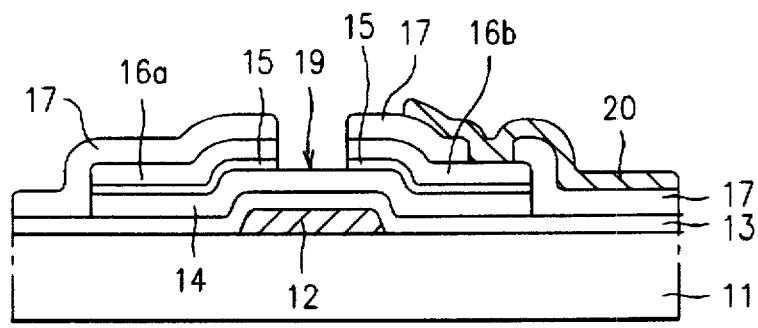
FIG. 3 is a sectional view showing a structure of a liquid crystal display unit according to the present invention.

Referring to FIG. 3, the liquid crystal display unit according to the present invention includes a substrate 11, a gate electrode 12 formed on a predetermined region of the substrate 11, a gate insulating layer 13 formed on the exposed surface of the substrate 11 including the gate electrode 12, an intrinsic semiconductor layer 14 and an impurity semiconductor layer 15 formed on the gate insulating layer 13, source and drain electrodes 16a and 16b formed on the impurity semiconductor layer 15 and separated by the channel length, an insulating layer 17 formed on the source and drain electrodes 16a and 16b, and a pixel electrode 20 formed on the insulating layer 17 and connected to the drain electrode 16b. The insulating layer 17 has a contact hole 19 for exposing a channel region.

FIGS. 4a to 4d are layout views and sectional views showing a fabricating process of the liquid crystal display unit of FIG. 3.

Figure 4A:
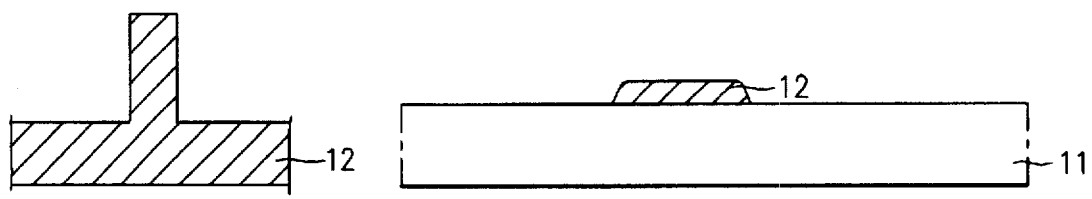
FIGS. 4a to 4d are layout views and sectional views showing a fabricating process of the liquid crystal display unit of FIG. 3.

Referring to FIG. 4a, a glass substrate 11 is prepared and a metal material is deposited on the entire surface of the glass substrate 11. The metal layer is selectively removed by a photolithographic process and an etching process to form the gate electrode 12. In such case, although not shown in the drawing, a storage capacitor electrode, a source pad and a gate pad are generally formed, together with the gate electrode 12.

Figure 4B:
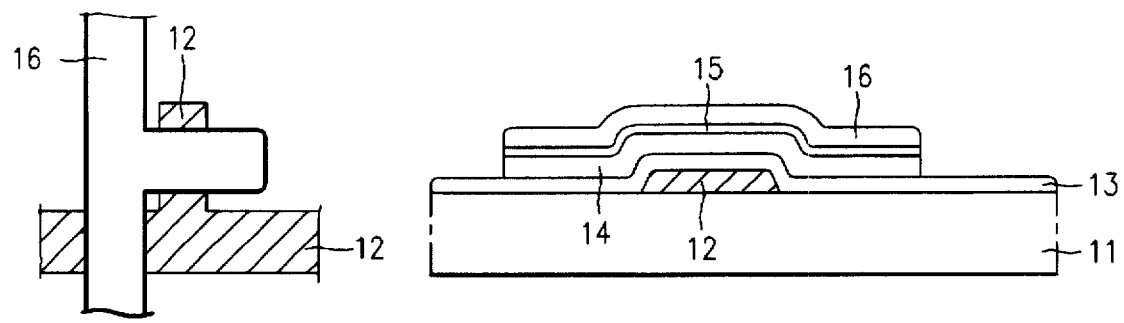

Referring to FIG. 4b, a nitride layer or an oxide layer is deposited on the entire surface of the substrate 11 to form the gate insulating layer 13. The amorphous silicon layer 14 and the n+ amorphous silicon layer 15 are deposited on the gate insulating layer 13. The n+amorphous silicon layer 15 is used as an ohmic contact layer considering its contact resistance with the amorphous semiconductor layer 14. The amorphous semiconductor layer 14 will be used as an active layer. The source and drain electrodes are formed by a subsequent process. A conductive layer 16 is deposited on the n+ amorphous silicon layer 15. Next, the conductive layer 16, the n+ amorphous silicon layer 15 and the amorphous silicon layer 14 are patterned simultaneously using the same pattern mask to be used as a data line and the source and drain electrodes.

Figure 4C:
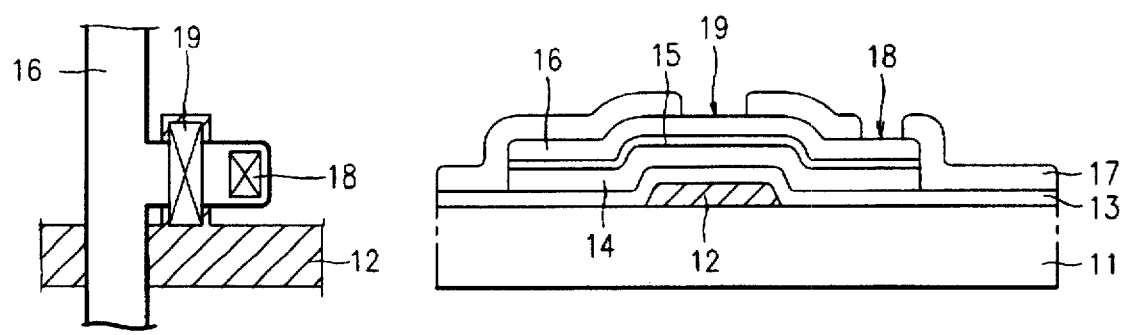

Referring to FIG. 4c, a nitride layer is deposited on the entire surface of the substrate 11 by chemical vapor deposition or other deposition methods to form the insulating layer 17. The insulating layer 17 is selectively removed until a pixel electrode contact region and a channel region of the conductive layer 16 are exposed to form first and second contact holes 18 and 19. The first contact hole 18 is formed on a drain electrode portion formed by a subsequent process and the second contact hole 19 is formed on the conductive layer over the gate electrode 12. Simultaneously, the insulating layer 17 is selectively removed so as to expose the source pad and the gate pad (not shown).

Figure 4D:
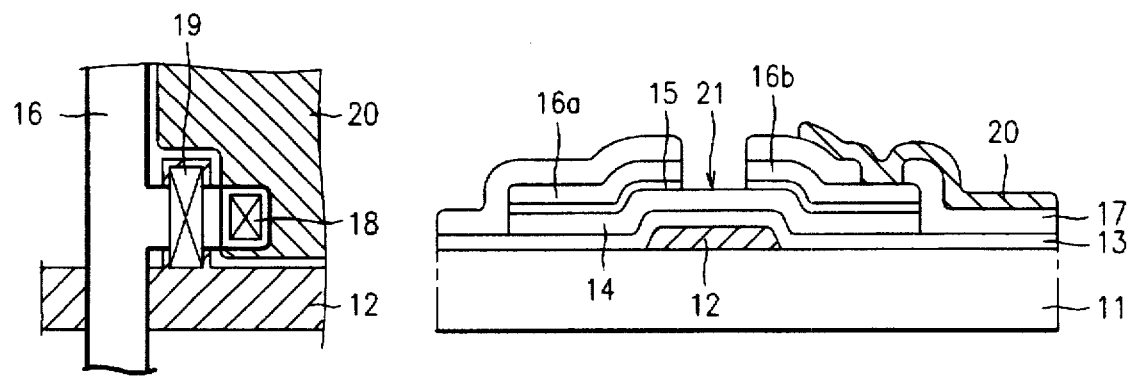

Referring to FIG. 4d, a transparent conductive material is deposited on the entire surface of the substrate to be electrically connected to the conductive layer 16 through the first contact hole 18 and selectively removed by photolithographic and etching processes to form the pixel electrode 20. The conductive layer 16 and the amorphous silicon layer 15 of the channel region are selectively removed using the pixel electrode 20 and the insulating layer 17 as a mask to form the source and drain electrodes 16a and 16b.

Consequently, since the amorphous silicon layer, the n+ amorphous silicon layer and the conductive layer are simultaneously patterned using the active region pattern mask, and since the conductive layer is patterned without an additional mask using the pixel electrode and the passivation layer, the number of mask processes is reduced to four. Moreover, since the structure and fabricating process of the present invention reduce the number of mask processes, the process time is reduced and the process is simplified, thereby improving the fabrication yield.

It will be apparent to those skilled in the art that various modifications and variations can be made in the structure of a liquid crystal display unit and the corresponding fabricating method of the present invention without departing from the spirit or scope of the invention. Thus, it is intended that the present invention cover the modifications and variations of this invention provided they come within the scope of the appended claims and their equivalents.

What is claimed is:

1. A liquid crystal display unit comprising:

a substrate;

a gate electrode formed on the substrate;

a gate insulating layer formed on the exposed surface of the substrate including the gate electrode;

an intrinsic semiconductor layer and an impurity layer formed on the gate insulating layer;

source and drain electrodes separately formed on the impurity semiconductor layer;

an insulating layer formed on the source and drain electrodes, the insulating layer having a contact hole for exposing a channel region; and a pixel electrode formed on the insulating layer and connected to the drain electrode.

2. A liquid crystal display unit comprising:

a substrate;

a gate electrode formed on the substrate;

a gate insulating layer formed on the substrate and the gate electrode;

an intrinsic semiconductor layer formed on the gate insulating layer;

an impurity layer formed on the intrinsic semiconductor layer;

a source electrode formed on the impurity semiconductor layer;

a drain electrode formed on the impurity semiconductor layer, the source and drain electrodes being separated;

an insulating layer formed on the source and drain electrodes, the insulating layer having a contact hole exposing a channel region; and a pixel electrode formed on the insulating layer, the pixel electrode being connected to the drain electrode.

3. The liquid crystal display unit according to claim 2, further comprising a storage capacitor electrode, a source pad and a gate pad.

4. The liquid crystal display unit according to claim 2, wherein the substrate is a glass substrate.

5. The liquid crystal display unit according to claim 2, wherein the gate insulating layer includes one of a nitride layer and an oxide layer.

6. The liquid crystal display unit according to claim 2, wherein the impurity layer includes an n+ silicon layer.

7. The liquid crystal display unit according to claim 2, wherein edge portions of the drain electrode, the impurity layer, and the intrinsic semiconductor layer are substantially vertically aligned.

8. The liquid crystal display unit according to claim 2, wherein the source and drain electrodes are formed on opposing sides of the channel region.

* * * * *